United States Patent
Pei et al.

(10) Patent No.: US 12,230,597 B2
(45) Date of Patent: Feb. 18, 2025

(54) PACKAGE STRUCTURE WITH WARPAGE-CONTROL ELEMENT

(71) Applicant: Taiwan Semiconductor Manufacturing Company, Ltd., Hsinchu (TW)

(72) Inventors: Hao-Jan Pei, Hsinchu (TW); Chih-Chiang Tsao, Taoyuan (TW); Wei-Yu Chen, Taipei (TW); Hsiu-Jen Lin, Zhubei (TW); Ming-Da Cheng, Taoyuan (TW); Ching-Hua Hsieh, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/336,516

(22) Filed: Jun. 16, 2023

(65) Prior Publication Data

US 2023/0335525 A1    Oct. 19, 2023

Related U.S. Application Data

(63) Continuation of application No. 17/360,681, filed on Jun. 28, 2021, now Pat. No. 11,721,659, which is a
(Continued)

(51) Int. Cl.
*H01L 23/00* (2006.01)
*H01L 21/56* (2006.01)
(Continued)

(52) U.S. Cl.
CPC ............ *H01L 24/19* (2013.01); *H01L 21/565* (2013.01); *H01L 21/6835* (2013.01);
(Continued)

(58) Field of Classification Search
CPC ....... H01L 21/56; H01L 21/565; H01L 21/60; H01L 23/3128; H01L 23/31; H01L 23/00; H01L 23/562; H01L 24/13; H01L 24/25; H01L 24/73; H01L 24/96; H01L 24/16; H01L 24/32; H01L 24/81; H01L 24/92; H01L 24/97; H01L 24/29; H01L 24/20; H01L 24/83; H01L 25/105; H01L 25/10; H01L 25/115; H01L 25/11; H01L 2221/68345; H01L 2221/68368; H01L 2221/68359; H01L 2224/13024; H01L 2224/19; H01L 2224/25171;
(Continued)

(56) References Cited

U.S. PATENT DOCUMENTS 6,930,388 B2    8/2005    Yamaguchi et al.
7,253,504 B1    8/2007    Zhai et al.
(Continued)

FOREIGN PATENT DOCUMENTS

TW    201532215 A    8/2015

*Primary Examiner* — Nikolay K Yushin
(74) *Attorney, Agent, or Firm* — Birch, Stewart, Kolasch & Birch, LLP

(57) ABSTRACT

A package structure is provided. The package structure includes a semiconductor chip and a protective layer laterally surrounding the semiconductor chip. The package structure also includes a polymer-containing element over the protective layer. The protective layer is wider than the polymer-containing element.

20 Claims, 20 Drawing Sheets

Related U.S. Application Data continuation of application No. 16/876,371, filed on May 18, 2020, now Pat. No. 11,049,832, which is a continuation of application No. 16/398,119, filed on Apr. 29, 2019, now Pat. No. 10,658,323, which is a continuation of application No. 15/499,962, filed on Apr. 28, 2017, now Pat. No. 10,276,536.

(51) Int. Cl.
| | | |
|---|---|---|
| *H01L 21/683* | (2006.01) | |
| *H01L 23/29* | (2006.01) | |
| *H01L 23/31* | (2006.01) | |
| *H01L 25/10* | (2006.01) | |
| *H01L 25/11* | (2006.01) | |

(52) U.S. Cl.
CPC ........ *H01L 23/293* (2013.01); *H01L 23/3128* (2013.01); *H01L 24/13* (2013.01); *H01L 24/25* (2013.01); *H01L 24/73* (2013.01); *H01L 24/96* (2013.01); *H01L 25/105* (2013.01); *H01L 25/115* (2013.01); *H01L 2221/68345* (2013.01); *H01L 2221/68368* (2013.01); *H01L 2224/13024* (2013.01); *H01L 2224/19* (2013.01); *H01L 2224/25171* (2013.01); *H01L 2224/2518* (2013.01); *H01L 2224/73209* (2013.01); *H01L 2225/1035* (2013.01); *H01L 2225/1058* (2013.01); *H01L 2924/3511* (2013.01)

(58) Field of Classification Search
CPC ... H01L 2224/2518; H01L 2224/73209; H01L 2224/131; H01L 2224/18; H01L 2224/12105; H01L 2224/83005; H01L 2224/16227; H01L 2224/2919; H01L 2224/32225; H01L 2224/73267; H01L 2224/81192; H01L 2224/83101; H01L 2224/92244; H01L 2224/96; H01L 2224/97; H01L 2224/83; H01L 2224/81; H01L 2924/0001; H01L 2225/1035; H01L 2225/1058; H01L 2225/107; H01L 2924/3511; H01L 2924/00014; H01L 2924/014; H01L 21/6835; H01L 21/683; H01L 23/293; H01L 23/29; H01L 23/02; H01L 23/28; H01L 24/19; H01L 24/10; H01L 24/18; H01L 24/26; H01L 24/34; H01L 24/42; H01L 24/50; H01L 24/63; H01L 24/71

See application file for complete search history.

(56) References Cited

U.S. PATENT DOCUMENTS

| | | |
|---|---|---|
| 8,779,606 B2 | 7/2014 | Yim et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,064,936 B2 | 6/2015 | Lin et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,524,956 B2 | 12/2016 | Pei et al. |
| 2002/0063332 A1 | 5/2002 | Yamaguchi et al. |
| 2012/0280404 A1 | 11/2012 | Kwon et al. |
| 2013/0200528 A1 | 8/2013 | Lin et al. |
| 2014/0264930 A1 | 9/2014 | Yu et al. |
| 2015/0008571 A1 | 1/2015 | Gallegos et al. |
| 2016/0126226 A1 | 5/2016 | Pei et al. |
| 2016/0190071 A1 | 6/2016 | Interrante et al. |

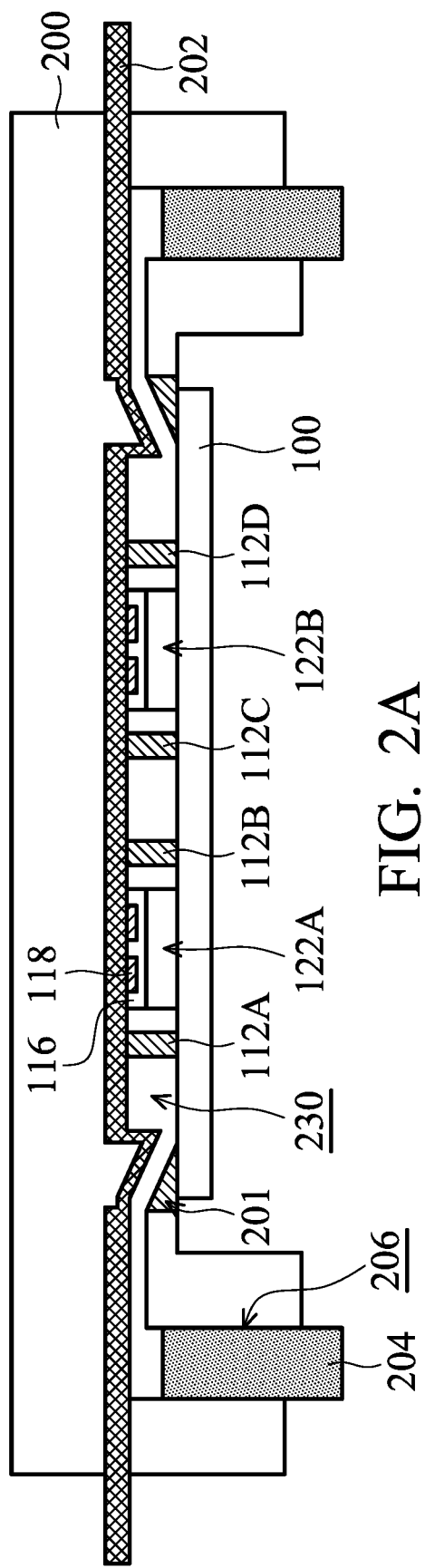
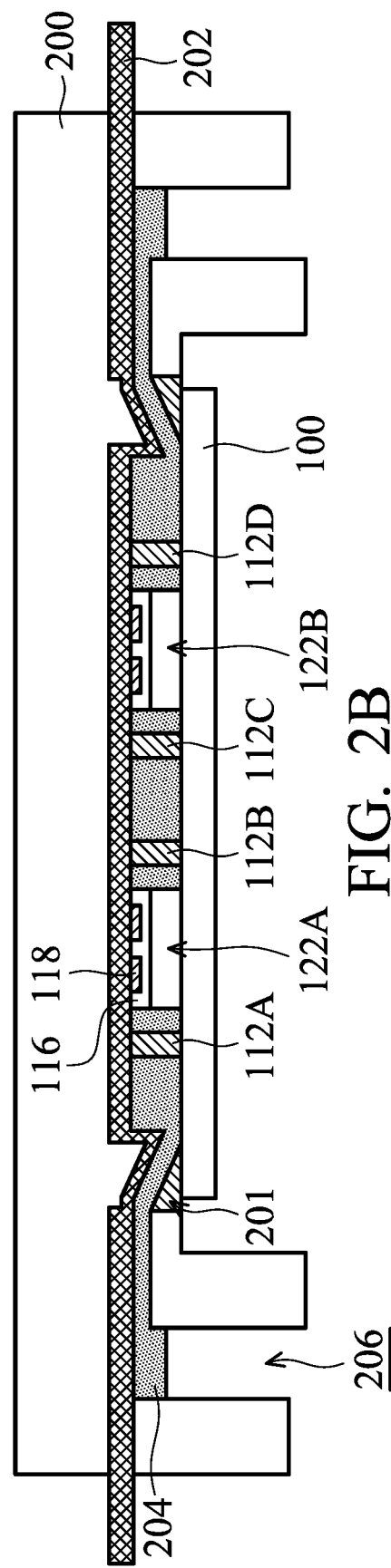
FIG. 2A
FIG. 2B

PACKAGE STRUCTURE WITH WARPAGE-CONTROL ELEMENT

CROSS REFERENCE

This application is a Continuation application of U.S. patent application Ser. No. 17/360,681, filed on Jun. 28, 2021, which is a Continuation application of U.S. patent application Ser. No. 16/876,371, filed on May 18, 2020, which is a Continuation application of U.S. patent application Ser. No. 16/398,119, filed on Apr. 29, 2019, which is a Continuation application of U.S. patent application Ser. No. 15/499,962, filed on Apr. 28, 2017, the entire of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2B are cross-sectional views of various stages of a process for forming a chip package, in accordance with some embodiments.

DETAILED DESCRIPTION

Figure 1A:
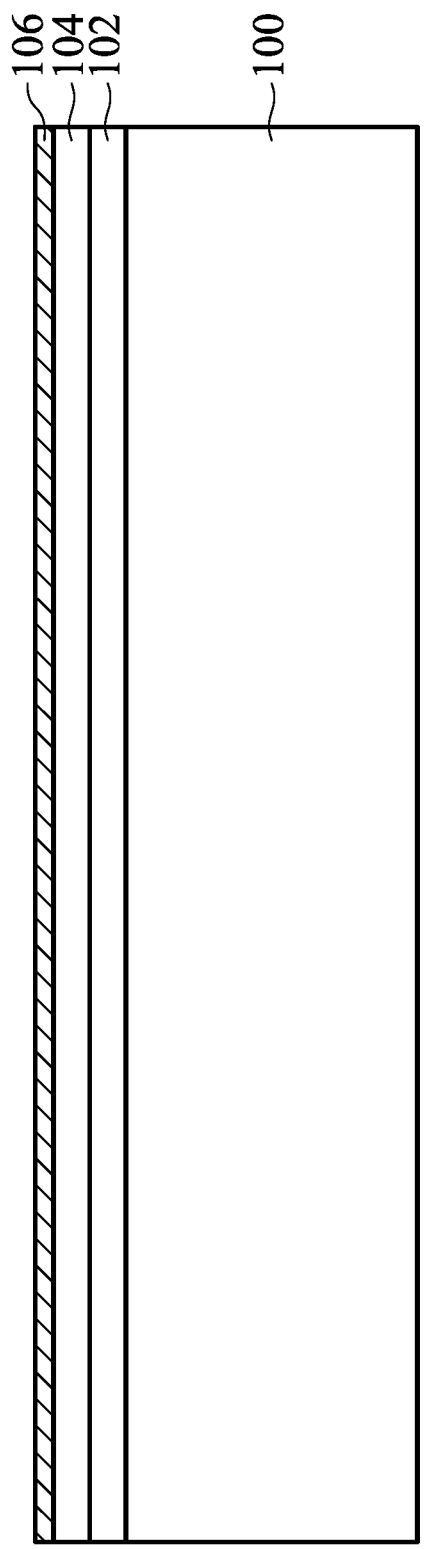
FIGS. 1A-1L are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may be applied in 3D packaging or 3D IC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a chip package, in accordance with some embodiments. As shown in FIG. 1A, an adhesive layer 102 and a base layer 104 are deposited or laminated over a carrier substrate 100, in accordance with some embodiments.

In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive. The adhesive layer 102 may be detached using a thermal operation.

In some embodiments, the base layer 104 is a polymer layer or a polymer-containing layer. The base layer 104 may be a polybenzoxazole (PBO) layer, a polyimide (PI) layer, a solder resist (SR) layer, an Ajinomoto buildup film (ABF), a die attach film (DAF), another suitable layer, or a combination thereof. In some embodiments, the base layer 104 includes multiple sub-layers.

Many variations and/or modifications can be made to embodiments of the disclosure. In some other embodiments, the base layer 104 is not formed.

Afterwards, a seed layer 106 is deposited over the base layer 104, as shown in FIG. 1A in accordance with some embodiments. In some embodiments, the seed layer 106 is made of a metal material. The metal material may be made of or include titanium (Ti), Ti alloy, copper (Cu), Cu alloy, another suitable material, or a combination thereof. In some other embodiments, the seed layer 106 includes multiple sub-layers.

In some embodiments, the seed layer 106 is deposited using a physical vapor deposition (PVD) process such as a sputtering process, a chemical vapor deposition (CVD) process, a spin-on process, another applicable process, or a combination thereof.

Many variations and/or modifications can be made to embodiments of the disclosure. In some other embodiments, the seed layer 106 is not formed.

Figure 1B:
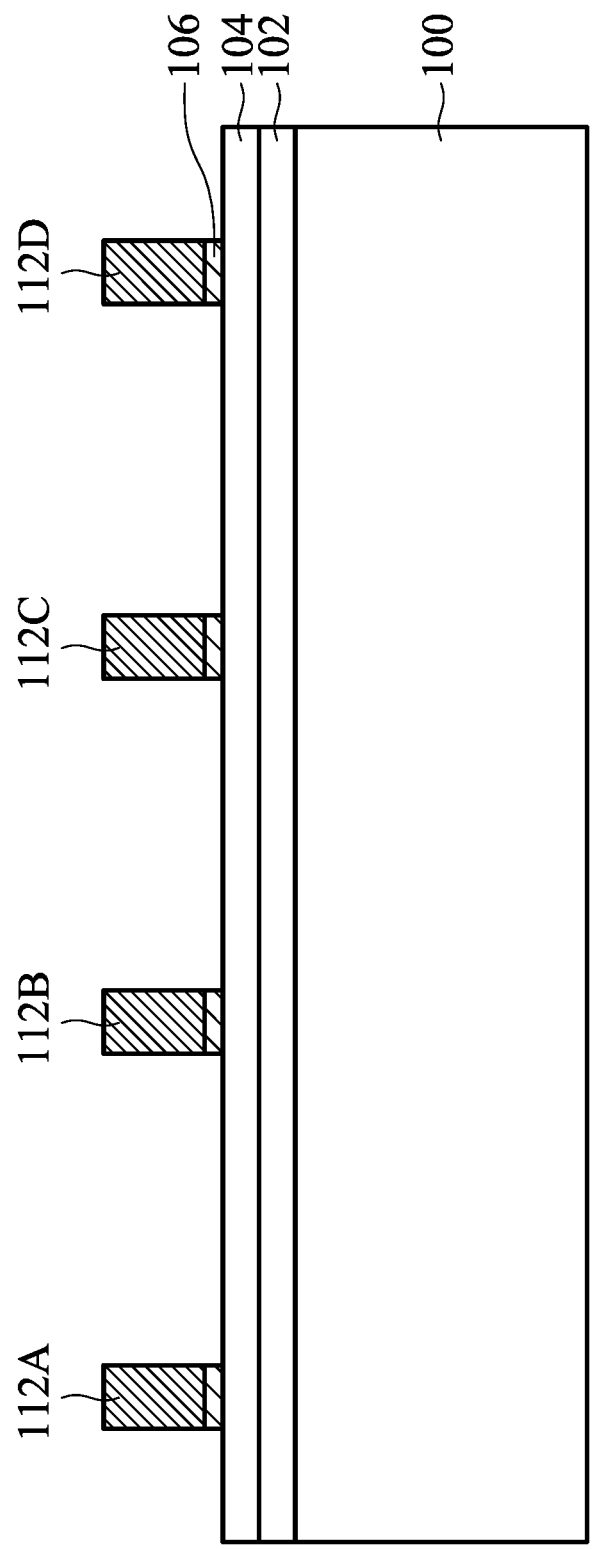

As shown in FIG. 1B, conductive structures including conductive structures 112A, 112B, 112C, and 112D are formed, in accordance with some embodiments. In some embodiments, the conductive structures 112A, 112B, 112C, and 112D include conductive pillars. In some embodiments, each of the conductive structures 112A, 112B, 112C, and 112D has a linear sidewall. In some embodiments, the linear sidewall is substantially perpendicular to a main surface of the base layer 104.

In some embodiments, a mask layer (not shown) is formed over the seed layer 106 to assist in the formation of the conductive structures 112A-112D. The mask layer has multiple openings that expose portions of the seed layer 106. The openings of the mask layer define positions where the conductive structures will be formed. In some embodiments, the mask layer is made of a photoresist material.

In some embodiments, the conductive structures 112A-112D are made of or include a metal material. The metal material may include Cu, Ti, gold (Au), cobalt (Co), aluminum (Al), tungsten (W), another suitable material, or a combination thereof. In some embodiments, the conductive structures 112A-112D are made of or include a solder material. The solder material may include tin (Sn). In some other embodiments, the conductive structures 112A, 112B, 112C, and 112D are made of a metal material that does not include Sn.

In some embodiments, the conductive structures 112A, 112B, 112C, and 112D are formed using a plating process utilizing the seed layer 106. The plating process may include an electroplating process, an electroless plating process, another applicable process, or a combination thereof.

However, many variations and/or modifications can be made to embodiments of the disclosure. In some other embodiments, the conductive structures 112A, 112B, 112C, and 112D are formed using a chemical vapor deposition (CVD) process, a physical vapor deposition (PVD) process, a spin-on process, another applicable process, or a combination thereof.

Afterwards, the mask layer is removed, and the portions of the seed layer 106 that are not covered by the conductive structures 112A-112D are removed, as shown in FIG. 1B in accordance with some embodiments. An etching process may be used to partially remove the seed layer 106. The conductive structures 112A-112D may function as an etching mask during the etching of the seed layer 106.

Many variations and/or modifications can be made to embodiments of the disclosure. In some other embodiments, the seed layer 106 and/or the conductive structures 112A-112D are not formed.

Figure 1C:
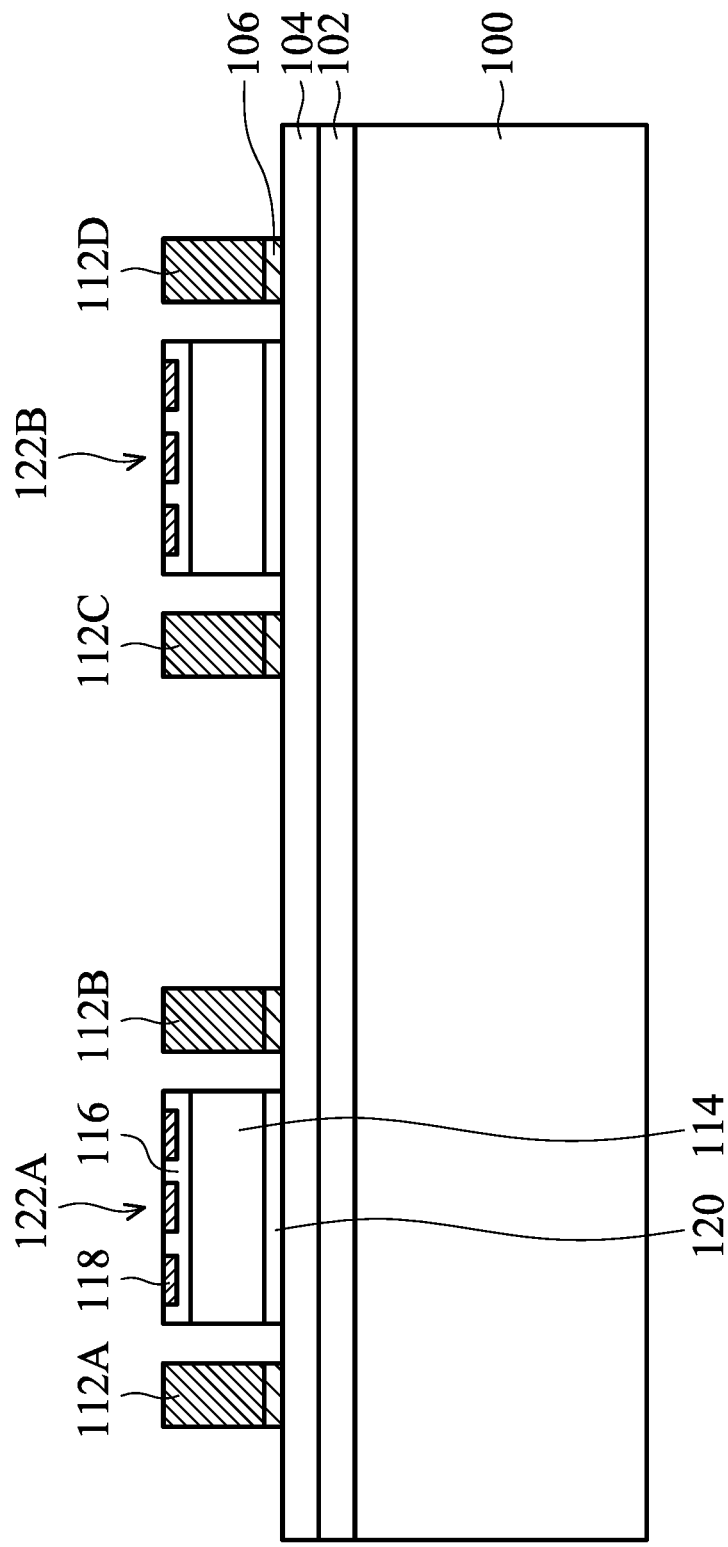

As shown in FIG. 1C, semiconductor dies including semiconductor dies 122A and 122B are attached over the carrier substrate 100, in accordance with some embodiments. In some embodiments, back sides of the semiconductor dies 122A and 122B face the base layer 104 with front sides of the semiconductor dies 122A and 122B facing away therefrom. An adhesive film 120 may be used to affix the semiconductor dies 122A and 122B to the base layer 104. The adhesive film 120 may include a die attach film (DAF), a glue, or another suitable film.

Each of the semiconductor dies 122A and 122B may include a semiconductor substrate 114, a dielectric structure 116, and conductive features 118 located at the front side thereof. The dielectric structure 116 may include multiple dielectric layers (not shown). The conductive features 118 may be conductive pads. In some embodiments, various device elements are formed in and/or on the semiconductor substrate 114.

Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the dielectric structure 116. The dielectric structure 116 may include multiple sub-layers. The conductive features may include multiple conductive lines, conductive contacts, and conductive vias. In some embodiments, electrical connections between the conductive features 118 and the device elements are formed through the conductive features formed in the dielectric structure 116. In some embodiments, the conductive features 118 are metal pads which may be made of aluminum or another suitable material.

The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 122A or 122B is a system-on-chip (SoC) chip that includes multiple functions.

Figure 1D:
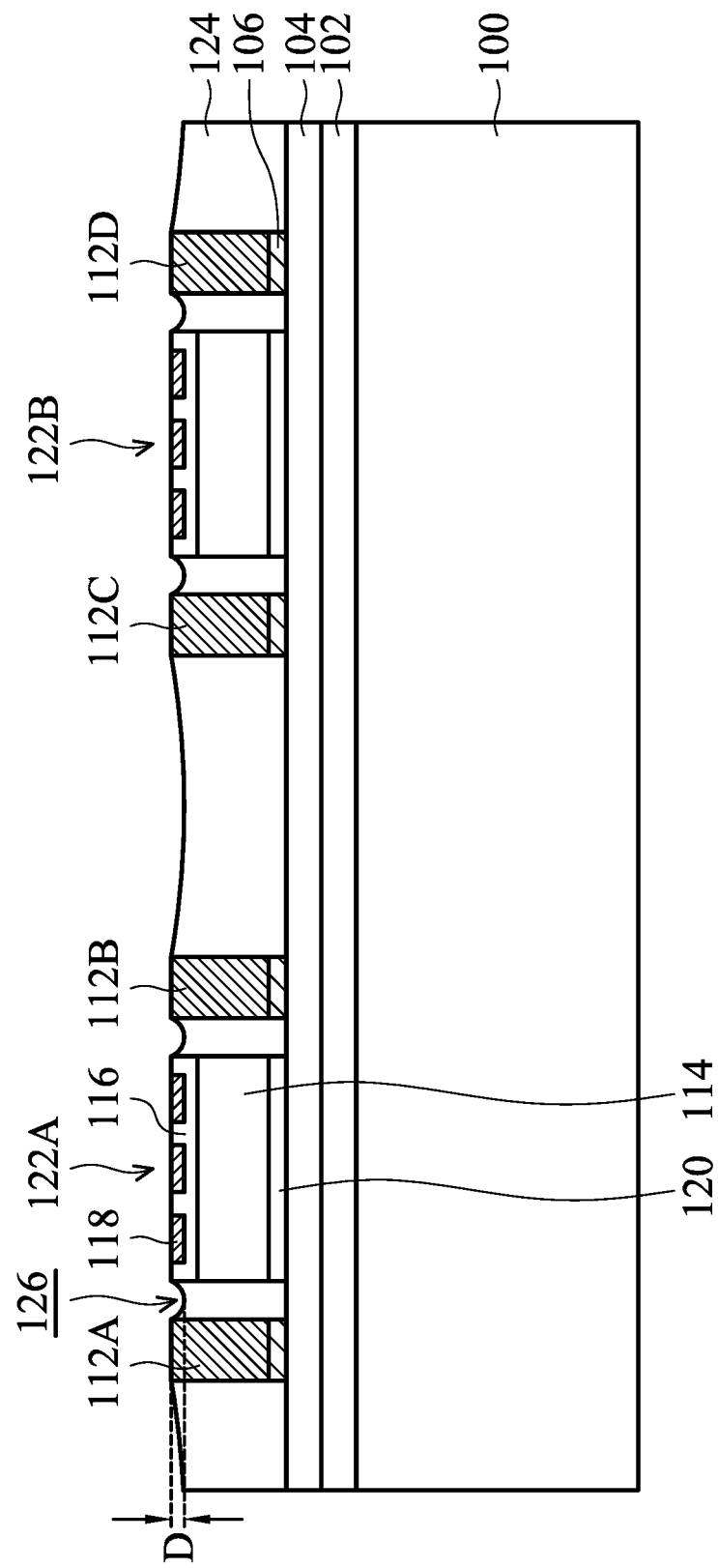

As shown in FIG. 1D, a protective layer 124 is formed over the carrier substrate 100 to surround the conductive structures 112A-112D and the semiconductor dies 122A and 122B, in accordance with some embodiments. In some embodiments, the protective layer 124 covers the sidewalls of the conductive structures 112A-112D and the semiconductor dies 122A and 122B.

In some embodiments, the protective layer 124 does not cover top surfaces of the conductive structures 112A-112D and of the semiconductor dies 122A and 122B. In some embodiments, the conductive structures 112A-112D penetrate through the protective layer 124. The conductive structures 112A-112D are used as through package vias (TPVs) or through integrated fan-out vias (TIVs). In some embodiments, the protective layer 124 includes a polymer material. In some embodiments, the protective layer 124 includes a molding compound material. The molding compound material may include an epoxy-based resin with fillers dispersed therein.

In some embodiments, the protective layer 124 is formed by injecting a molding compound material over the carrier substrate 100. In some embodiments, after or during the injecting of the molding compound material, the molding compound material does not cover the top surfaces of the conductive structures 112A-112D and/or the semiconductor dies 122A and 122B.

In some embodiments, a liquid molding compound material is disposed over the carrier substrate 100 to encapsulate the conductive structures 112A-112D and the semiconductor dies 122A and 122B. The liquid molding compound material may be made of or include liquid state epoxy resin, liquid state epoxy acrylate, liquid state epoxy resin with filler, liquid state epoxy acrylate with filler, one or more other suitable liquid state materials, or a combination thereof. In some embodiments, a thermal process is then applied to harden the liquid molding compound material and to transform it into the protective layer 124.

In some embodiments, the thermal process is performed at a temperature in a range from about 200 degrees C. to about 250 degrees C. The operation time of the thermal process may be in a range from about 0.5 hour to about 3 hours.

In some embodiments, a mold is used to assist in the formation of the protective layer 124. FIGS. 2A-2B are cross-sectional views of various stages of a process for forming the protective layer 124 of a chip package, in accordance with some embodiments.

As shown in FIG. 2A, a mold 200 is disposed over the carrier substrate 100, in accordance with some embodiments. In some embodiments, a space 230 is formed between the mold 200 and the carrier substrate 100, as shown in FIG. 2A.

In some embodiments, the mold 200 includes a sealing element 201. The sealing element 201 may be used to cover the peripheral region of the carrier substrate 100. In some embodiments, the sealing element 201 is a sealing ring. The sealing element 201 may also be used as a settling element that affixes the carrier substrate 100 under the mold 200.

However, many variations and/or modifications can be made to embodiments of the disclosure. In some other embodiments, the sealing element 201 is not formed.

In some embodiments, the mold 200 includes a release film 202. The space 230 is surrounded by the carrier substrate 100, the sealing element 201, and the release film 202. In some embodiments, the release film 202 is made of a material that has a poor adhesion with a material used for forming the protective layer 124. In some embodiments, the release film 202 is in direct contact with the conductive structures 112A, 112B, 112C, and 112D after the mold 200 is disposed over the carrier substrate 100. In some embodiments, the release film 202 is also in direct contact with the semiconductor dies 122A and 122B.

However, many variations and/or modifications can be made to embodiments of the disclosure. In some other embodiments, the release film 202 is not included.

In some embodiments, the mold 200 has one or more openings 206. Each of the openings 206 may be used to allow a molding compound material 204 to be injected into the mold 200. In some embodiments, one or more of the openings 206 are used to allow the molding compound material 204 to flow out of the mold 200. In some embodiments, each of the openings 206 is used for letting the molding compound material 204 flow into the mold 200. In some other embodiments, the mold 200 has only one opening 206 that allows the molding compound material 204 to flow into the space 230.

Afterwards, the molding compound material 204 is injected into the space 230 between the mold 200 and the carrier substrate 100 until the molding compound material 204 completely fill the space 230, as shown in FIG. 2B, in accordance with some embodiments. The conductive structures 112A-112D are surrounded by the molding compound material 204. The semiconductor dies 122A and 122B are also surrounded by the molding compound material 204, as shown in FIG. 2B in accordance with some embodiments.

In some embodiments, the release film 202 is in direct contact with the conductive structures 112A, 112B, 112C, and 112D during the injecting of the molding compound material 204. In some embodiments, the release film 202 is also in direct contact with the semiconductor dies 122A and 122B during the injecting of the molding compound material 204.

Afterwards, the molding compound material 204 is cured to become the protective layer 124, and the mold 200 is then removed, as shown in FIG. 1D in accordance with some embodiments. In some embodiments, the molding compound material 204 is cured to form the protective layer 124 before the removal of the mold 200.

Many variations and/or modifications can be made to embodiments of the disclosure. In some other embodiments, a first thermal operation is performed before the removal of the mold 200, followed by a second thermal operation performed after the removal of the mold 200. The first thermal operation is performed at a lower temperature than the second thermal operation. The second thermal operation is used to complete the curing of the molding compound material 204 after the mold 200 is removed. As a result, the protective layer 124 is formed.

In some embodiments, during the injecting of the molding compound material 204, the molding compound material 204 does not cover the top surfaces of the conducting structures 112A-112D and/or the semiconductor dies 122A and 122B due to the mold 200. As a result, the top surfaces of the conducting structures 112A-112D and the semiconductor dies 122A and 122B are not covered by the protective layer 124, as shown in FIG. 1D. In some embodiments, it is not necessary for the protective layer 124 to be thinned since the conductive structures 112A-112D and the conductive features 118 of the semiconductor dies 122A and 122B have been exposed without being covered by the protective layer 124.

In some embodiments, since no thinning process on the protective layer 124 is required, fabrication cost and processing time are reduced. Damage due to the thinning process may also be prevented. In some embodiments, no additional passivation layer or conductive pillars needs to be formed on the semiconductor dies, and so the fabrication cost and processing time are reduced further.

In some embodiments, the adhesion between the molding compound material 204 and the release film 202 is poor. Therefore, the molding compound material 204 may be prevented from adhering on the mold 200 during the subsequent removal of the mold 200. After the removal of the mold 200, recesses may be formed at the surface of the molding compound material 204. As a result, there are also some recesses 126 formed at the surface of the protective layer 124 after the molding compound material 204 is cured to form the protective layer 124.

As shown in FIG. 1D, the protective layer 124 has recesses 126, in accordance with some embodiments. Some of the recesses 126 are adjacent to the semiconductor die 122A or 122B. Some of the recesses 126 are between the semiconductor die 122A or 122B and one of the conductive structures 112A, 112B, 112C, and 112D. Some of the recesses 126 are between two of the conductive structures, such as between the conductive structures 112B and 112C. As shown in FIG. 1D, one of the recesses 126 has a depth D. In some embodiments, the depth D is in a range from about 3 μm to about 10 μm. For example, the depth D may be about 7 μm.

Figure 1E:
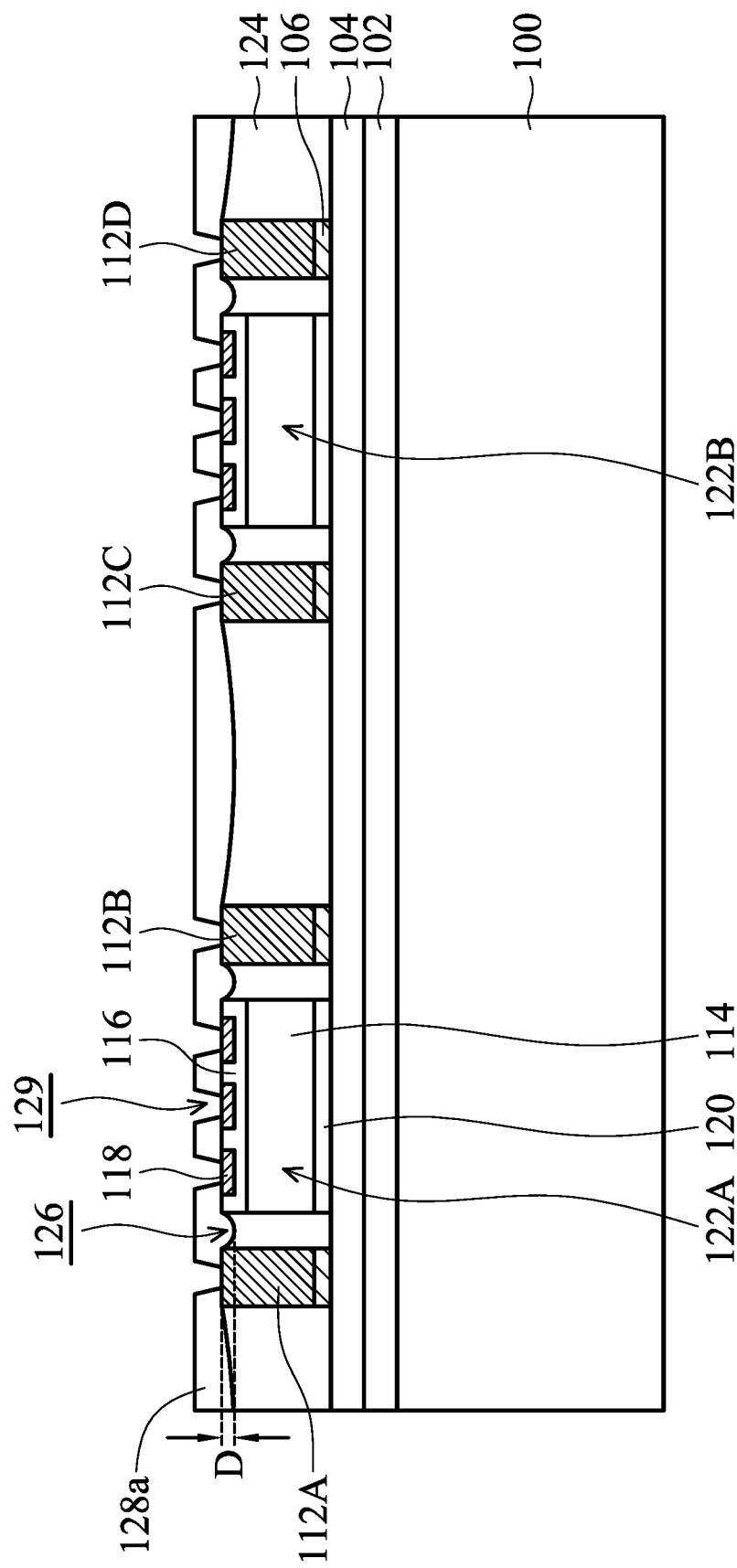

As shown in FIG. 1E, a dielectric layer 128a is formed over the protective layer 124, the conductive structures 112A-112D, and the semiconductor dies 122A and 122B. In some embodiments, the dielectric layer 128a fills the recesses 126 of the protective layer 124. In some embodiments, the dielectric layer 128a is made of or includes one or more polymer materials. The dielectric layer 128a may be made of or include polybenzoxazole (PBO), polyimide (PI), another suitable material, or a combination thereof. In some embodiments, the dielectric layer 128a is formed using a spin coating process, a spray coating process, another applicable process, or a combination thereof.

As shown in FIG. 1E, the dielectric layer 128a is patterned to form multiple openings 129, in accordance with some embodiments. In some embodiments, some of the openings 129 correspondingly expose the conductive structures 112A-112D. In some embodiments, some of the openings 129 correspondingly expose the conductive features 118 of the semiconductor dies 122A and 112B. In some embodiments, the openings 129 are formed using a photolithography process, a laser drilling process, an etching process, another applicable process, or a combination thereof.

Figure 1F:
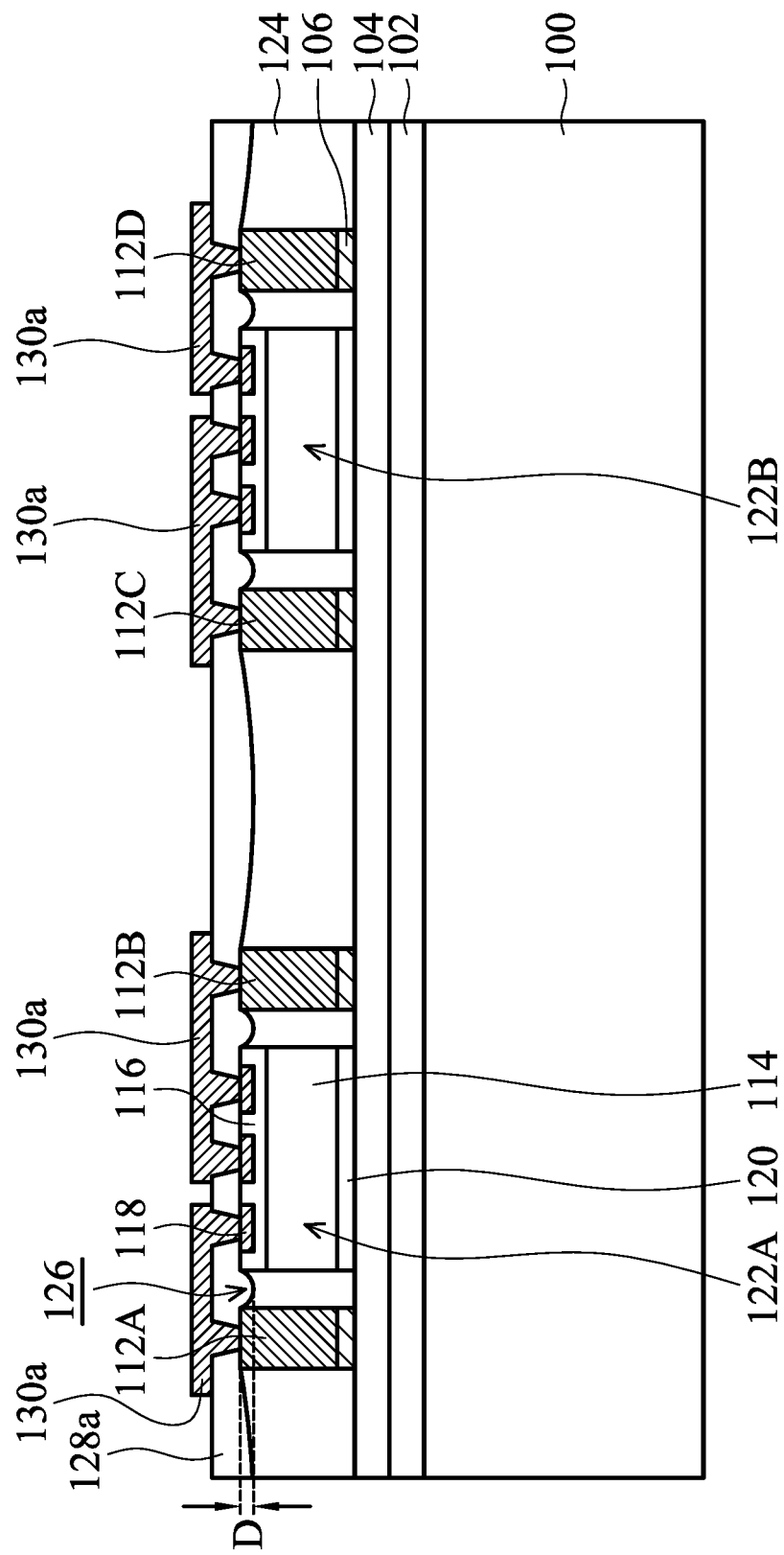

Afterwards, conductive layers 130a are formed over the dielectric layer 128a, as shown in FIG. 1F in accordance with some embodiments. In some embodiments, each of the conductive layers 130a fills the corresponding opening 129. In some embodiments, each conductive structure 112A to 112D is electrically connected to a corresponding one of the conductive layers 130a through a corresponding one of the openings 129. In some embodiments, each conductive feature 118 (such as a conductive pad) of the semiconductor die 122A is electrically connected to a corresponding one of the conductive layers 130a through a corresponding one of the openings 129. In some embodiments, the conductive structure 112A is electrically connected to one of the conductive features 118 of the semiconductor die 122A through the corresponding one of the conductive layers 130a.

Figure 1G:
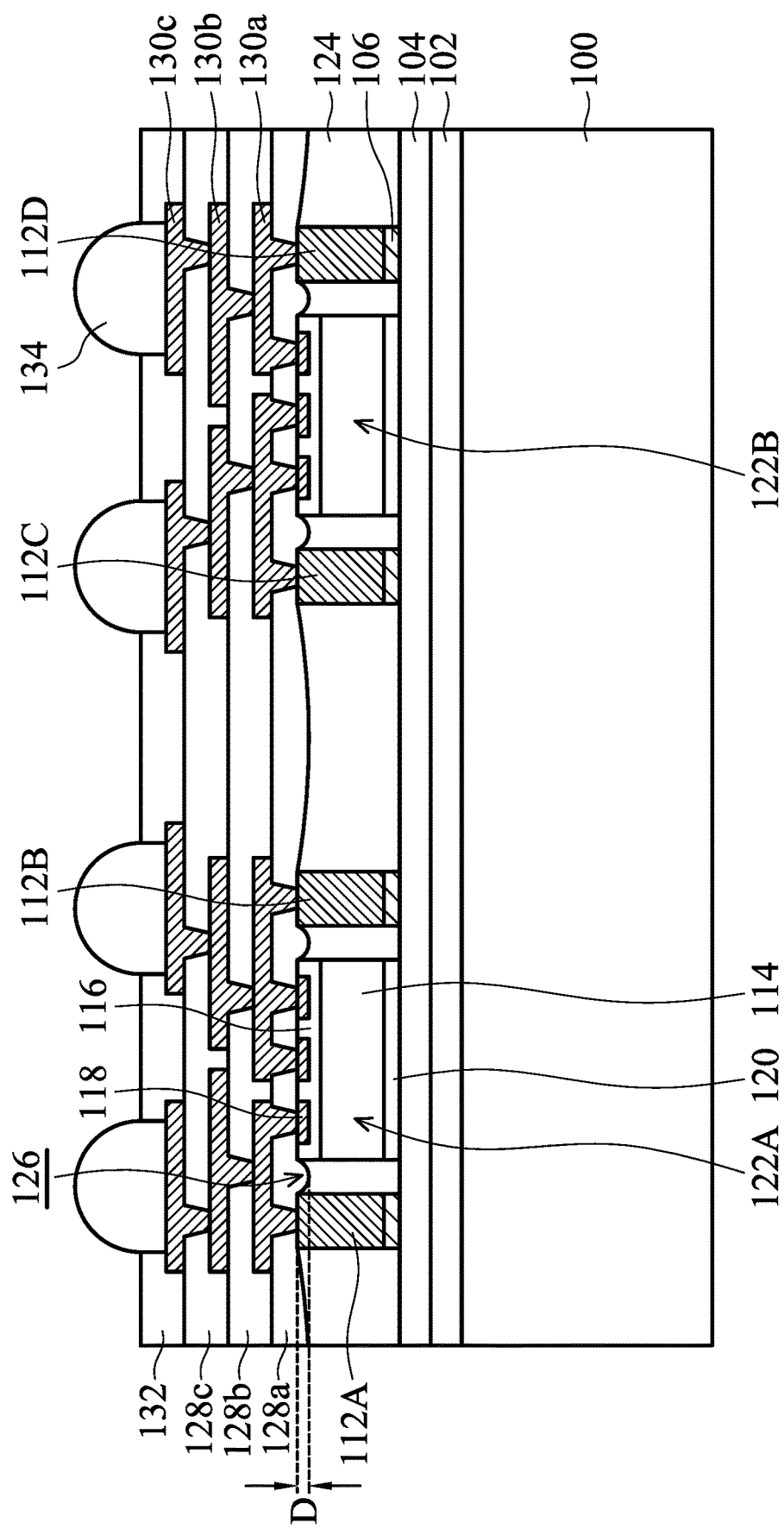

Referring to FIG. 1G, a dielectric layer 128b is formed over the dielectric layer 128a and the conductive layers 130a, in accordance with some embodiments. In some embodiments, the material and formation method of the dielectric layer 128b is the same as or similar to those of the dielectric layer 128a.

However, embodiments of the disclosure are not limited thereto. In some other embodiments, the dielectric layer 128b is made of a different dielectric material than the dielectric layer 128a. In some embodiments, the dielectric layer 128b is made of silicon oxide or the like using a deposition process, such as a chemical vapor deposition (CVD) process.

Afterwards, multiple dielectric layers including a dielectric layer 128c and a passivation layer 132 and multiple conductive layers including conductive layers 130b and 130c are formed, as shown in FIG. 1G in accordance with some embodiments. In some embodiments, conductive bumps 134 are formed. An under bump metallurgy (UBM) layer (not shown) may be formed between the conductive bumps 134 and the conductive layers 130c.

Figure 1H:
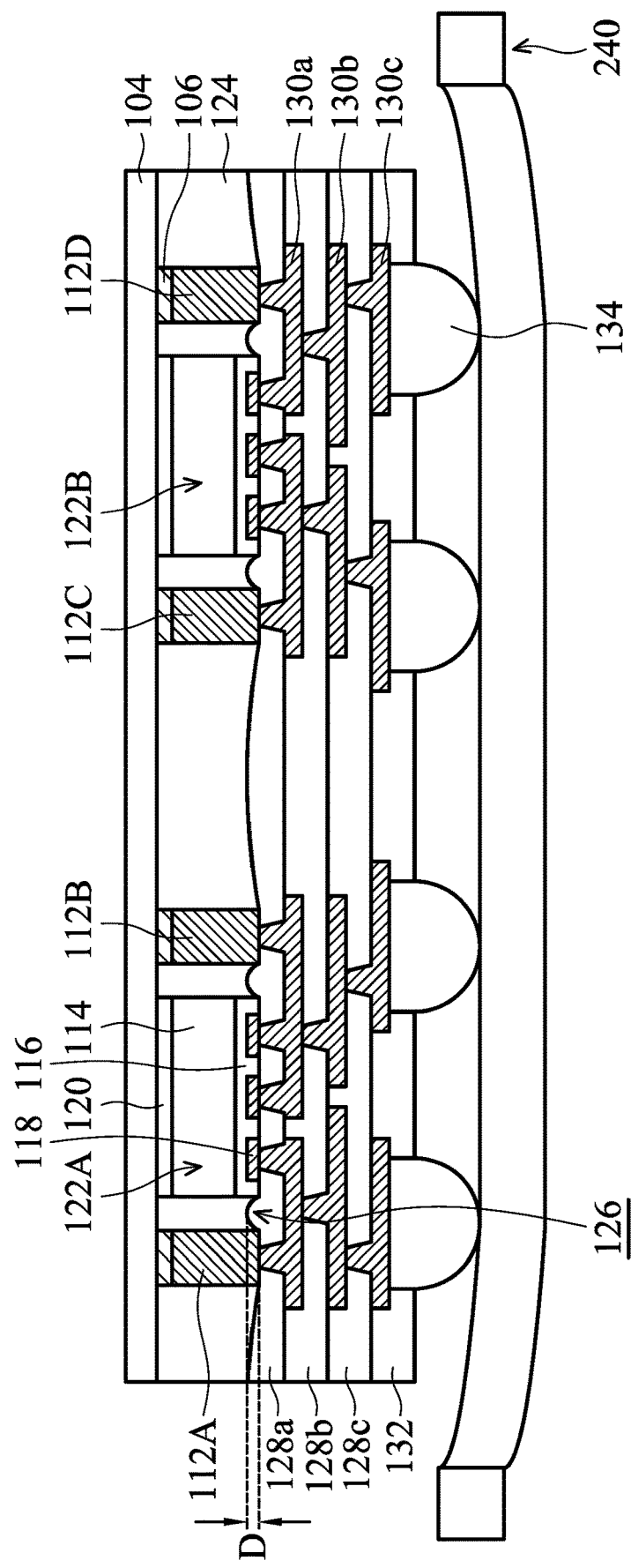

Afterwards, the structure shown in FIG. 1G is placed upside down on a carrier tape 240, as shown in FIG. 1H in accordance with some embodiments. The carrier substrate 100 and adhesive layer 102 are removed, as shown in FIG. 1H. The carrier substrate 100 and adhesive layer 102 may be removed using a light irradiation operation, a thermal operation, another applicable operation, or a combination thereof.

Figure 1I:
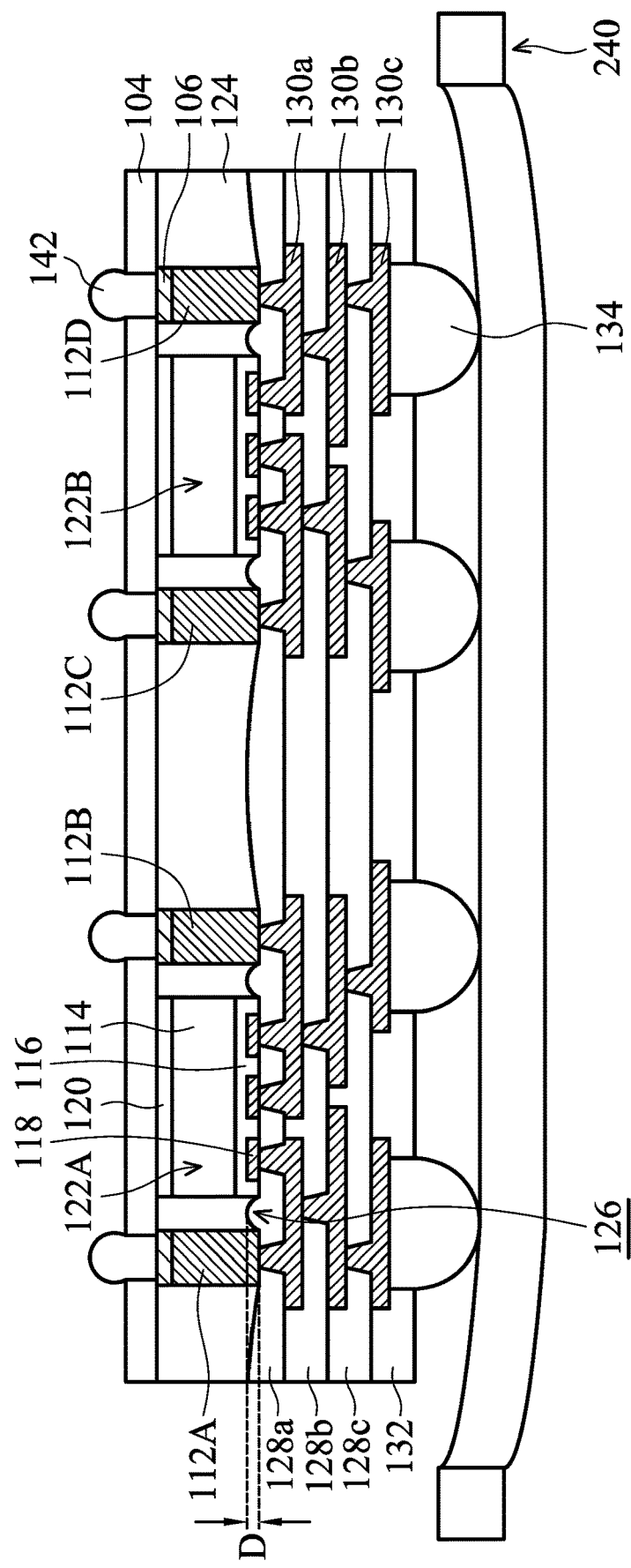

As shown in FIG. 1I, multiple conductive bumps 142 are formed over the protective layer 124, in accordance with some embodiments. In some embodiments, the conductive bumps 142 are made of or include a solder material. The solder material may include tin and other metal materials. In some embodiments, the conductive bumps 142 are made of or include copper, gold, aluminum, titanium, cobalt, platinum, another suitable material, or a combination thereof.

In some embodiments, multiple openings are formed in the base layer 104. Some or all of the openings expose the remaining seed layer 106 on the conductive structures such as 112A, 112B, 112C, and 112D. The remaining seed layer 106 and the conductive structures 112A, 112B, 112C, and 112D together form conductive pillars. Afterwards, one or more conductive materials are formed in the openings to form the conductive bumps 142, as shown in FIG. 1I. The conductive materials may be formed using an electroplating process, an electroless plating process, a printing process, another applicable process, or a combination thereof.

Afterwards, warpage-control elements are formed over the base layer 104 to prevent or to compensate for the warpage that occurs during the formation of the chip package. In some embodiments, the warpage-control elements are in direct contact with the base layer 104. In some embodiments, the warpage-control elements are formed using a printing process, a dispensing process, another applicable process, or a combination thereof.

Figure 1J:
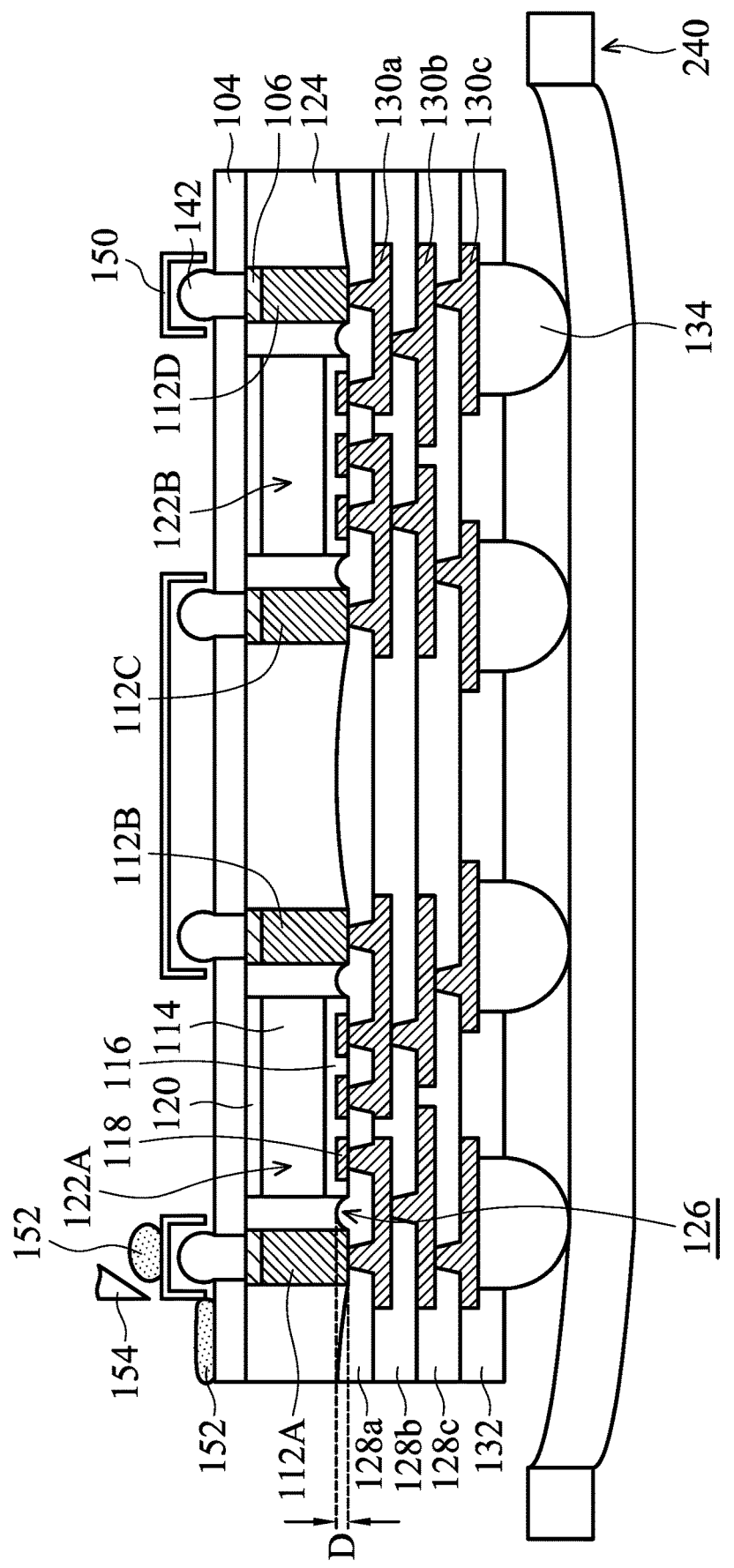

As shown in FIG. 1J, a stencil (or a mask) 150 is placed over the base layer 104 and the conductive bumps 142, in accordance with some embodiments. The stencil 150 has openings that are used to define patterns of warpage-control elements that will be formed later.

Afterwards, a squeegee 154 is used to move a warpage-control material 152 into the openings of the stencil 150, as shown in FIG. 1J in accordance with some embodiments. Therefore, the warpage-control material 152 is printed thereon.

In some embodiments, the warpage-control material 152 is made of or includes a polymer-containing material. The polymer-containing material may be in a liquid state. In some embodiments, the polymer-containing material includes an epoxy-based resin, a PBO-containing material, another suitable material, or a combination thereof. In some embodiments, the warpage-control material 152 is similar to or the same as an underfill material. In some embodiments, the warpage-control material 152 includes a polymer-containing material and fillers dispersed in the polymer-containing material. The fillers may include insulating fibers, insulating particles, other suitable elements, or a combination thereof.

In some embodiments, the warpage-control material 152 further includes one or more pigments. For example, a black pigment is added in the polymer-containing material. In some embodiments, the base layer 104 has a greater light transmittance than that of the warpage-control material 152. In some embodiments, the base layer 104 has a greater light transmittance than that of the warpage-control elements 152' formed from the warpage-control material 152. In some embodiments, the base layer 104 has a greater light transmittance than that of the protective layer 124.

Many variations and/or modifications can be made to embodiments of the disclosure. In some other embodiments, the warpage-control material 152 is applied over the base layer 104 using another applicable process other than the printing process. For example, the warpage-control material 152 (such as the polymer-containing material) is applied using a dispensing process.

Figure 1K:
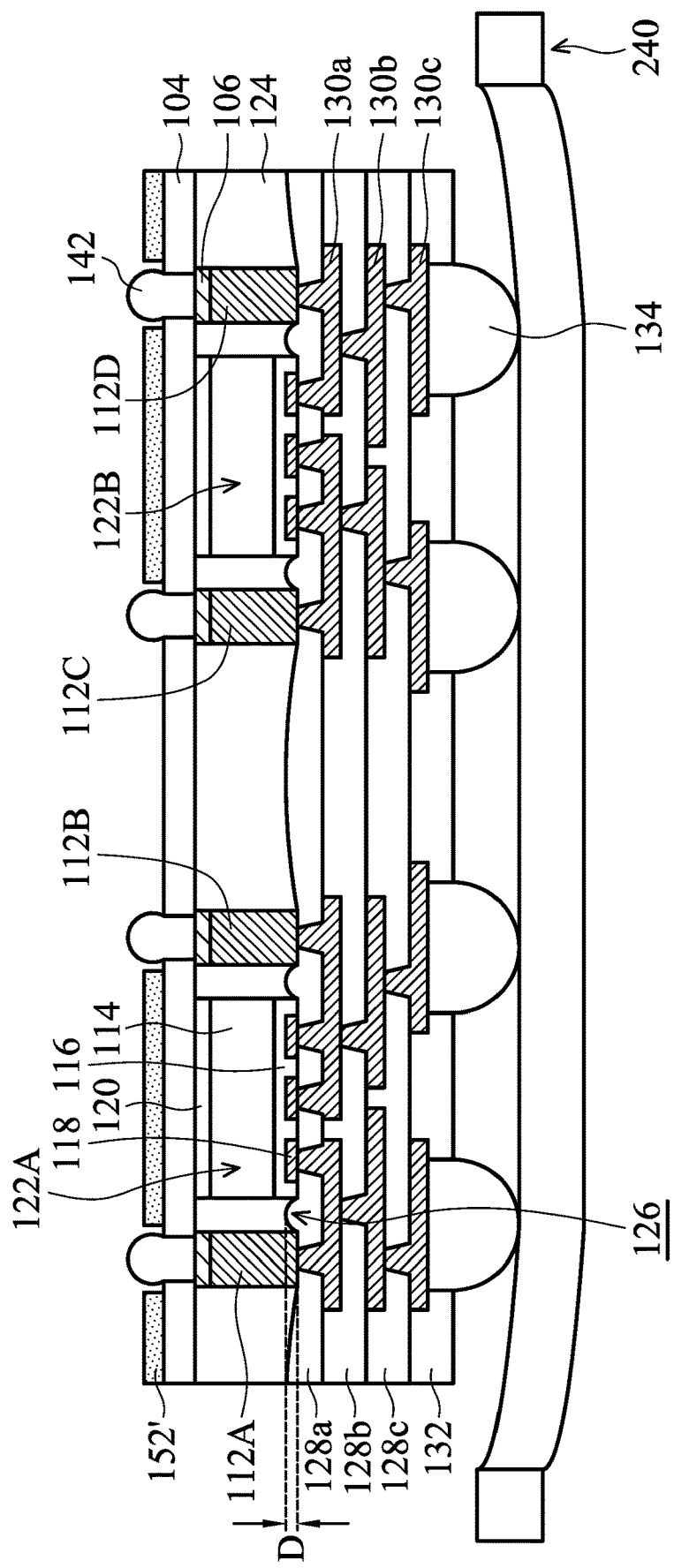

As shown in FIG. 1K, after the printing process, the warpage-control elements 152' are formed, in accordance with some embodiments. The warpage-control elements 152' are used to prevent or compensate for the warpage of the structure shown in FIG. 1K. In some embodiments, some or all of the warpage-control elements 152' are not in direct contact with the conductive bumps 142.

In some embodiments, a curing operation is used to transform the printed warpage-control material 152 into warpage-control elements 152'. In some embodiments, the curing operation includes a thermal operation. In some embodiments, the curing temperature of the curing operation is in a range from about 100 degrees C. to about 300 degrees C. In some other embodiments, the curing temperature of the curing operation is in a range from about 180 degrees C. to about 250 degrees C. In some embodiments, the operation time of the curing process is in a range from 30 minutes to about 2 hours. In some other embodiments, the curing operation includes a light irradiation operation. During the curing operation, the warpage is prevented or compensated for. As a result, a structure that has substantially no warpage is obtained.

In some embodiments, the warpage-control elements 152' are obtained from curing the printed warpage-control material 152 other than being provided as a preformed film or tape. Fabrication costs regarding the expensive tapes and the lamination tools are prevented or reduced. Fabrication time is also reduced accordingly. In some embodiments, the warpage-control elements 152' are formed using a printing process, which allows the conductive bumps 142 to be formed before the warpage-control elements 152'. The process for forming the chip package becomes relatively easy to perform according to these embodiments.

Figure 1L:
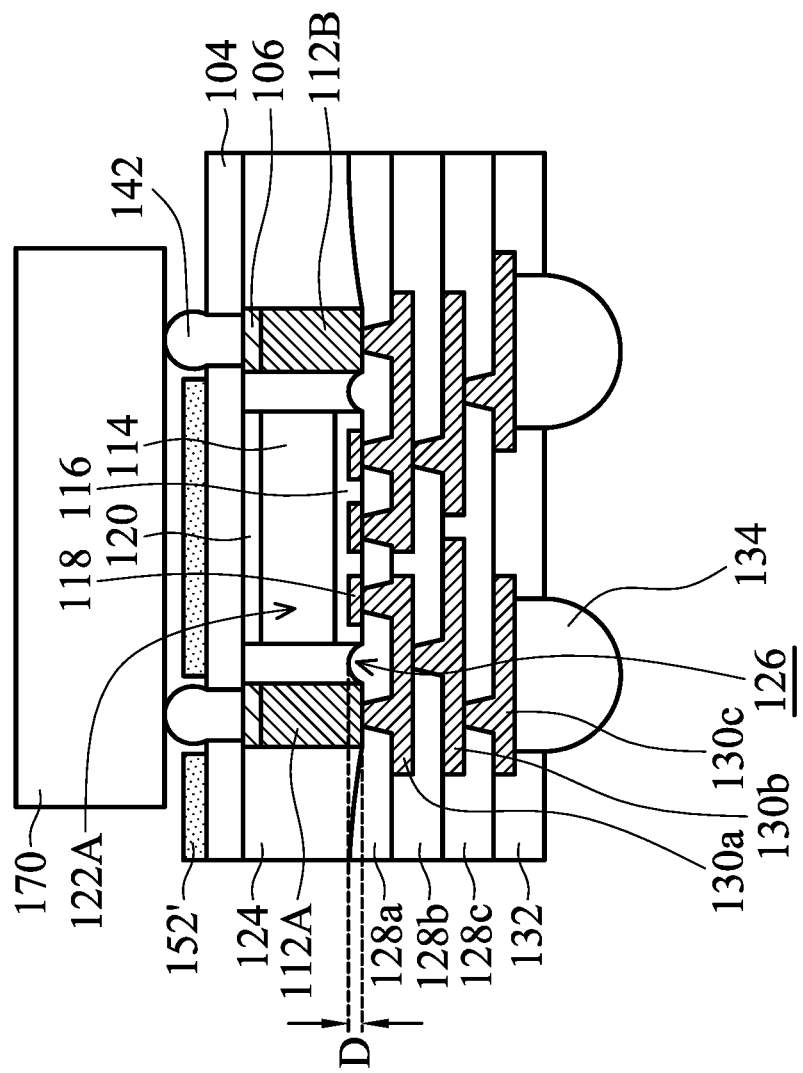

Afterwards, a dicing process (or a cutting operation) is performed to separate the structure as shown in FIG. 1K into multiple chip packages, as shown in FIG. 1L in accordance with some embodiments. As a result, a chip package with a fan-out structure is formed. In some embodiments, the carrier tape 240 is removed after the dicing process. In some embodiments, the top surface of the warpage-control elements 152' is lower than the top points of the conductive bumps 142.

In some embodiments, one or more elements are stacked on or bonded onto the structure as shown in FIG. 1K before the dicing process or onto the structure as shown in FIG. 1L after the dicing process. As shown in FIG. 1L, the element mentioned above (such as an element 170) is stacked over chip package, in accordance with some embodiments. The element 170 may include another chip package, a semiconductor die, one or more passive devices, another suitable structure, or a combination thereof.

However, embodiments of the disclosure are not limited thereto. In some other embodiments, the element 170 is not formed or stacked.

In some embodiments, the conductive bumps 142 form electrical connections between the element 170 and the semiconductor die 122A. The conductive bumps 142 may be bonded to one or more conductive feature of the element 170.

Many variations and/or modifications can be made to embodiments of the disclosure. In some embodiments, the element 170 is stacked before the dicing process. In some other embodiments, the element 170 is stacked after the dicing process.

Figure 3A:
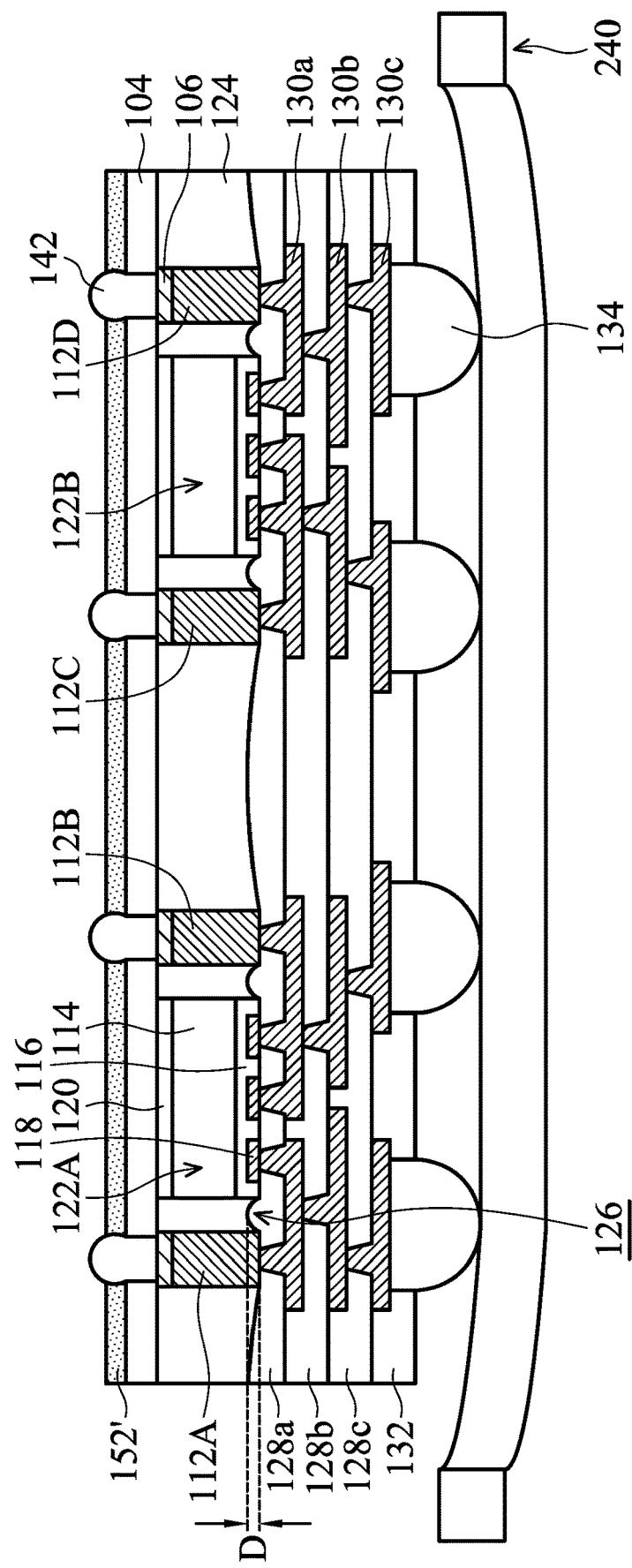
FIG. 3A is a cross-sectional view of an intermediate stage of a process for forming a chip package, in accordance with some embodiments.

In the embodiments illustrated in FIGS. 1A-1L, the warpage-control elements 152' are separated from the conductive bumps 142. However, embodiments of the disclosure are not limited thereto. FIG. 3A is a cross-sectional view of an intermediate stage of a process for forming a chip package, in accordance with some embodiments. In some embodiments, the warpage-control elements 152' are in direct contact with the conductive bumps 142. In some embodiments, the warpage-control elements 152' continuously and/or completely surround the conductive bumps 142. In some embodiments, by modifying the openings of the stencil 150, the patterns and/or the positions of the warpage-control elements 152' are modified accordingly.

Figure 3B:
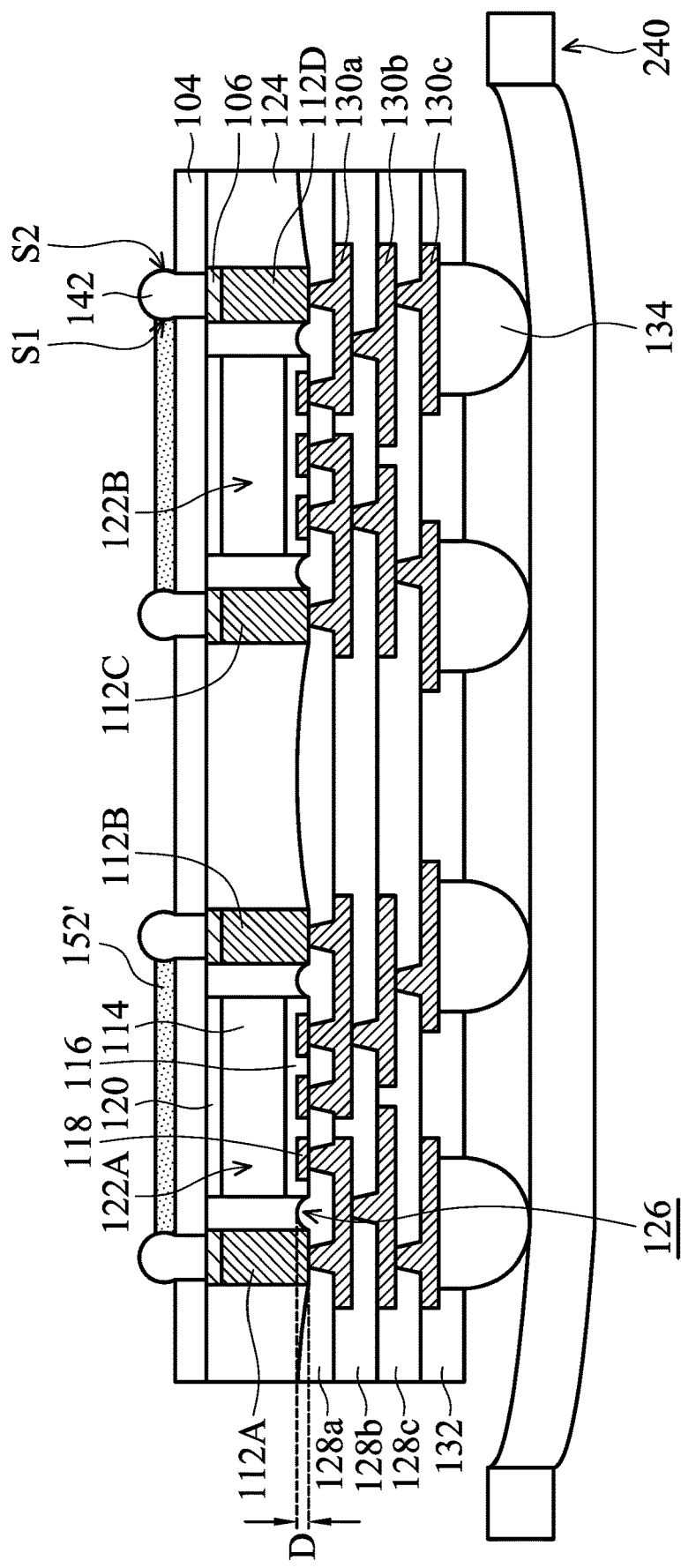
FIG. 3B is a cross-sectional view of an intermediate stage of a process for forming a chip package, in accordance with some embodiments.

Many variations and/or modifications can be made to embodiments of the disclosure. FIG. 3B is a cross-sectional view of an intermediate stage of a process for forming a chip package, in accordance with some embodiments. In some embodiments, some of the conductive bumps 142 are not continuously and/or completely surrounded by the warpage-control elements 152', as shown in FIG. 3B. In some embodiments, one of the warpage-control elements 152' is in direct contact with a side S1 of one of the conductive bumps 142 while an opposite side S2 of the conductive bump 142 is not in direct contact with the warpage-control elements 152', as shown in FIG. 3B.

In the embodiments illustrated in FIGS. 1A-1L, the conductive bumps 142 are formed before the formation of the warpage-control elements 152'. However, many variations and/or modifications can be made to embodiments of the disclosure. In some other embodiments, the conductive bumps 142 are formed after the formation of the warpage-control elements 152'.

Figure 4A:
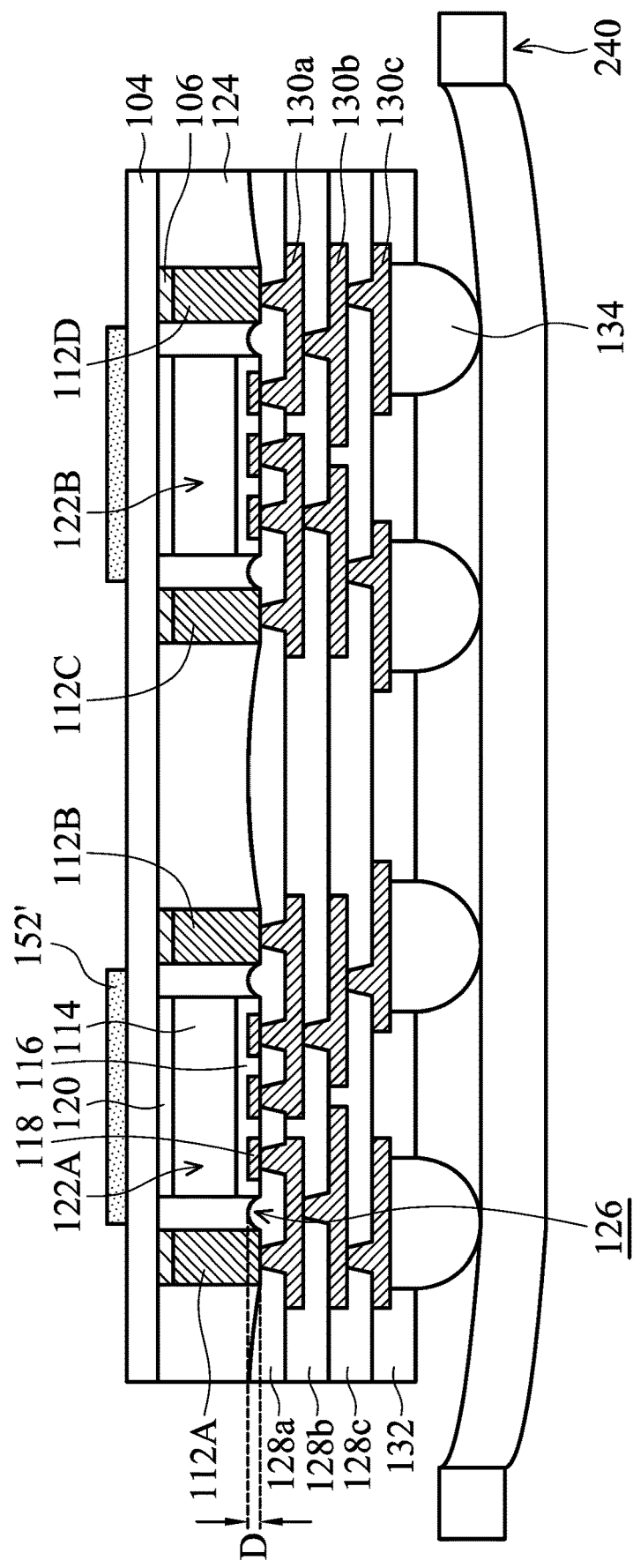
FIGS. 4A-4C are cross-sectional views of various stages of a process for forming a chip package, in accordance with some embodiments.
Figure 4B:
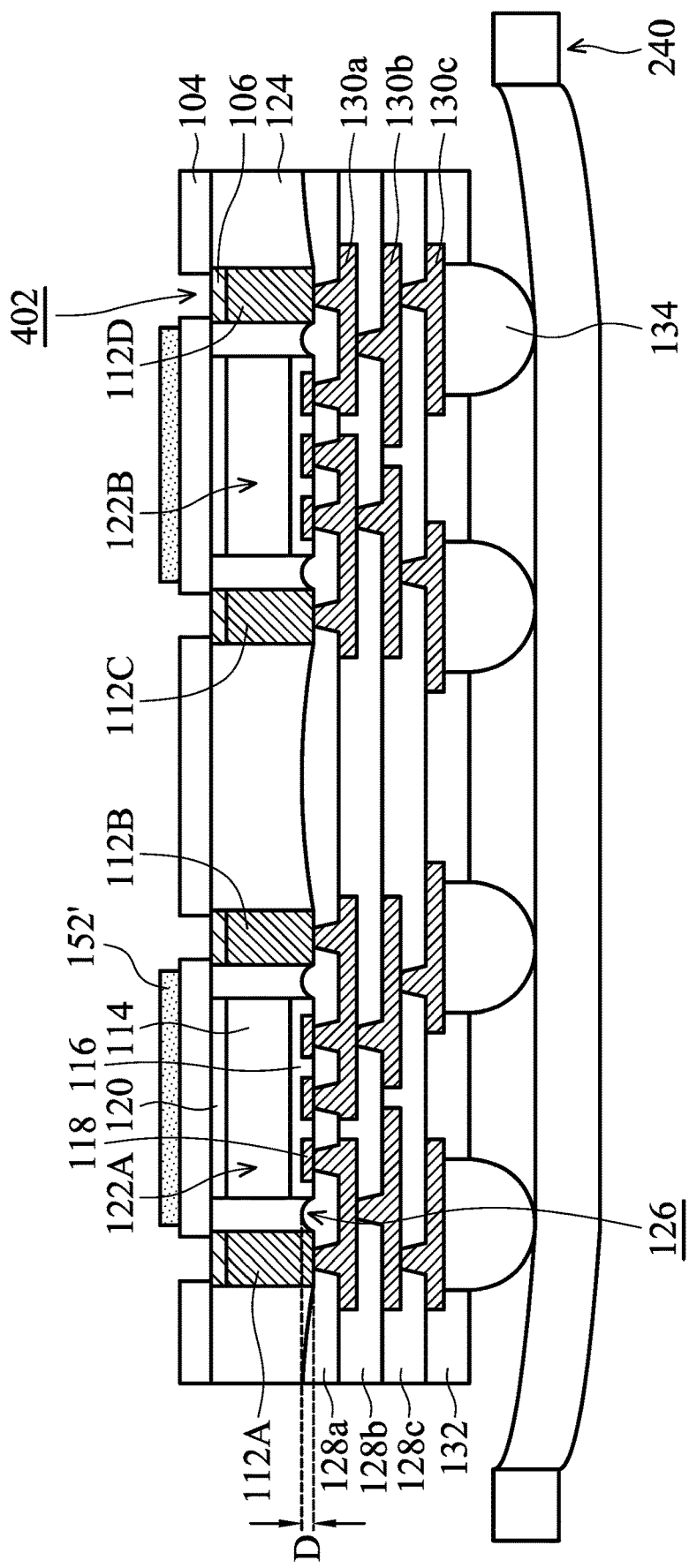
Figure 4C:
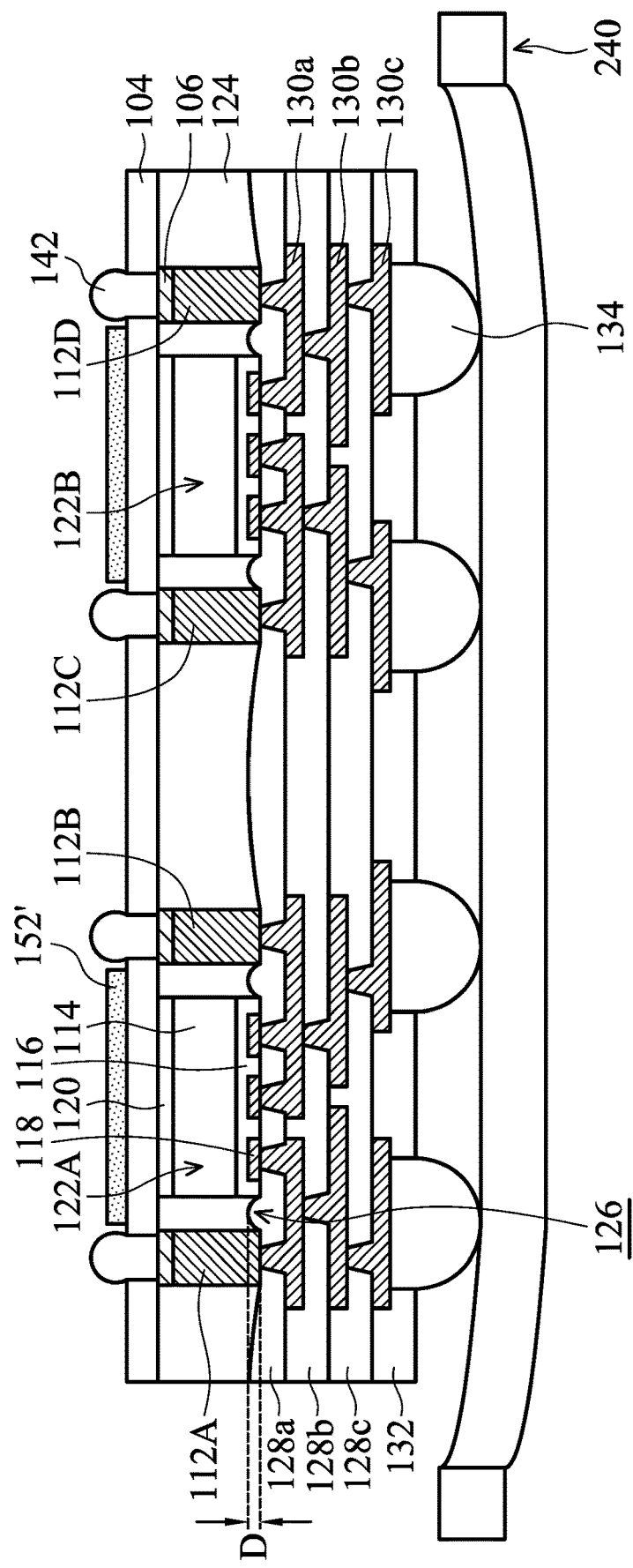

FIGS. 4A-4C are cross-sectional views of various stages of a process for forming a chip package, in accordance with some embodiments. As shown in FIG. 4A, a structure similar to or the same as that shown in FIG. 1H is received or formed. Afterwards, the warpage-control elements 152' are formed over the base layer 104, as shown in FIG. 4A in accordance with some embodiments. The material and formation method of the warpage-control elements 152' shown in FIG. 4A may be similar to or the same as those of the warpage-control elements 152' illustrated in FIGS. 1J-1K.

As shown in FIG. 4B, openings 402 are formed in the base layer 104 to expose the conductive pillars constructed by the seed layer 106 and the conductive structures 112A-112D, in accordance with some embodiments. The openings 402 may be formed using a photolithography process, a laser drilling process, an etching process, a mechanical drilling process, another applicable process, or a combination thereof.

In some embodiments, the warpage-control elements 152' do not cover the conductive pillars construed by the seed layer 106 and the conductive structures 112A-112D. Therefore, during the formation of the openings 402, the positions of the conductive pillars can be observed or detected since the base layer 104 has relatively high light transmittance. The alignments between the openings 402 and the conductive pillars are relatively easy to be achieved. In some other cases where a warpage tape is used, misalignments between the openings 402 and the conductive pillars might occur since the warpage tape having a low light transmittance covers the conductive pillars.

Many variations and/or modifications can be made to embodiments of the disclosure. In some other embodiments, the warpage-control elements 152' are formed after the formation of the openings 402.

As shown in FIG. 4C, the conductive bumps 142 are formed to fill the openings 402, in accordance with some embodiments. The material and formation method of the conductive bumps 142 shown in FIG. 4C may be similar to or the same as those of the conductive bumps 142 illustrated in FIG. 1I.

Figure 5B:
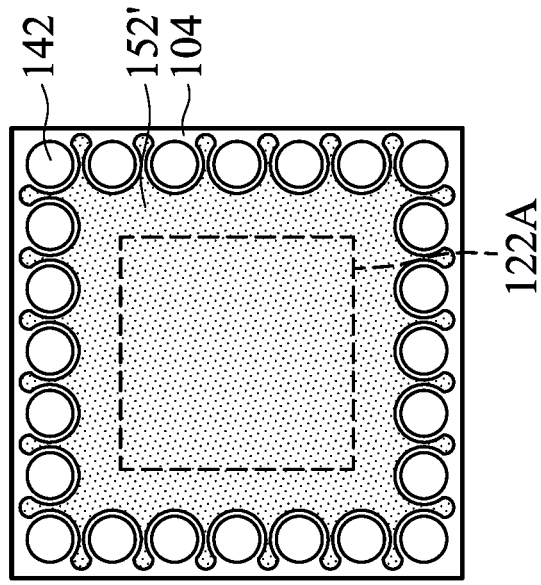
FIGS. 5A-5D are top views of chip packages, in accordance with some embodiments.
Figure 5A:
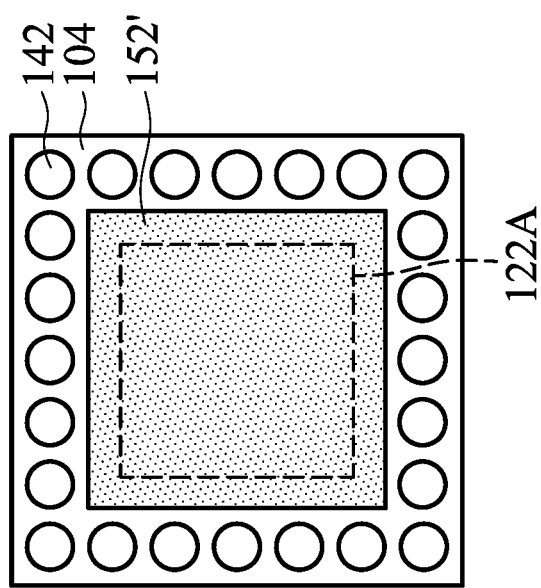

FIG. 5A is a top view of a chip package, in accordance with some embodiments. In some embodiments, FIG. 5A shows the top view of a chip package similar to that shown in FIG. 1L. For clarity, the element 170 is not shown. In some other embodiments, the element 170 is not formed.

In some embodiments, the chip package includes only one warpage-control element 152'. In some other embodiments, the chip package includes multiple warpage-control elements 152' that are separated from each other. In some embodiments, the warpage-control element 152' is separated from the conductive bumps 142 without fully surrounding the conductive bumps 142. In some embodiments, the conductive bumps 142 surround or encircle the warpage-control element 152'.

In FIG. 5A, since the semiconductor die 122A is covered by the base layer 104, dashed lines are used to illustrate the position and profile of the semiconductor die 122A. In some embodiments, the warpage-control element 152' has a greater area than that of the semiconductor die 122A. As shown in FIG. 5A, the semiconductor die 122A is covered by the warpage-control element 152'.

FIG. 5B is a top view of a chip package, in accordance with some embodiments. In some embodiments, some of the conductive bumps 142 are partially surrounded by the warpage-control element 152'. A portion of the warpage-control element 152' extends between two adjacent conductive bumps 142.

Figure 5D:
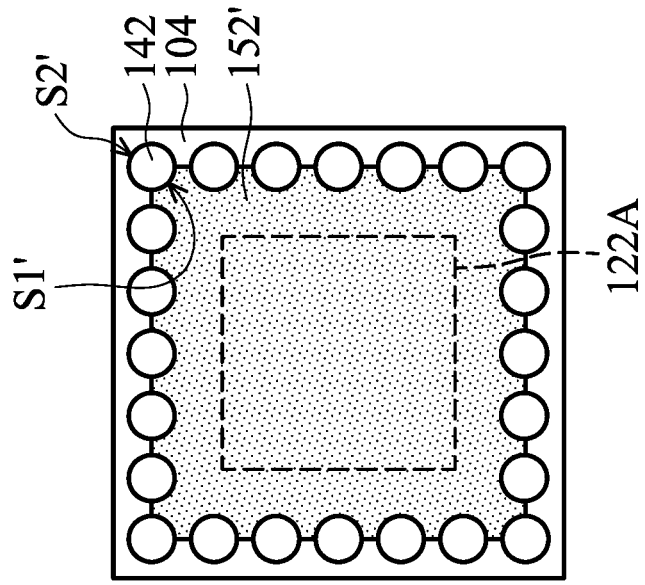
Figure 5C:
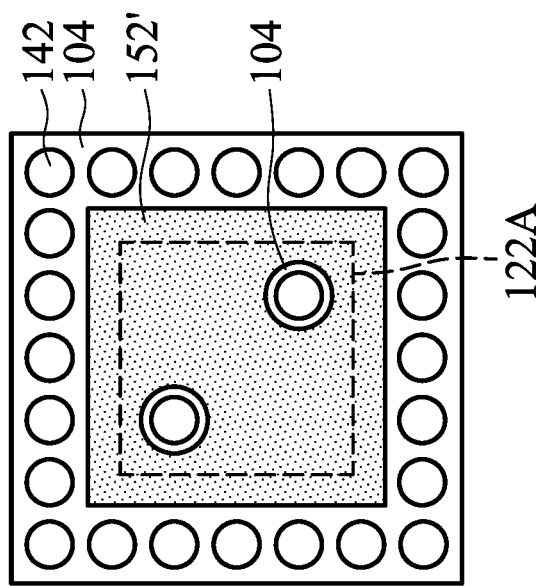

FIG. 5C is a top view of a chip package, in accordance with some embodiments. In some embodiments, the conductive bumps 142 are not only positioned on periphery portions of the base layer 104. Some of the conductive bumps 142 are positioned on the semiconductor die 122A. Some of the conductive bumps 142 cover the semiconductor die 122A. For example, when the size of the semiconductor die 122A is relatively small or the number of the conductive bumps 142 to be provided in the chip package is a lot, some of the conductive bumps 142 may be positioned directly above the semiconductor die 122A. In some embodiments, the warpage-control element 152' is separated from the conductive bumps 142. In some embodiments, the conductive bumps 142 are continuously and/or completely surrounded by the warpage-control element 152', as shown in FIG. 5C.

FIG. 5D is a top view of a chip package, in accordance with some embodiments. In some embodiments, the warpage-control element 152' partially surrounds the conductive bumps 142. In some embodiments, the warpage-control element 152' is in direct contact with some of the conductive bumps 142. In some embodiments, inner sides S1' of the conductive bumps 142 facing a center of the chip package are in direct contact with the warpage-control element 152'. Outer sides S2' of the conductive bumps 142 are not in direct contact with the warpage-control element 152', as shown in FIG. 5D.

Many variations and/or modifications can be made to embodiments of the disclosure. In some embodiments, the warpage-control element 152' covers the entire top surface of the base layer 104. In these cases, the conductive bumps 142 surrounded by the warpage-control element 152'.

Embodiments of the disclosure form a chip package having a semiconductor die surrounded by a protective layer. One or more warpage-control elements are printed over (but are not laminated over) the protective layer to prevent or compensate for the warpage of the chip package. Fabrication cost and processing time due to the warpage tape lamination are prevented or reduced. The position and pattern of the warpage-control element can be controlled more easily, which facilitates subsequent processes including the formation of the conductive bumps. The performance and quality of the chip package are significantly improved.

In accordance with some embodiments, a method for forming a chip package is provided. The method includes forming a protective layer to surround a semiconductor die, and the protective layer has opposing first and second surfaces. The method also includes forming a dielectric layer over the first surface of the protective layer and the semiconductor die. The method further includes forming a conductive feature over the dielectric layer such that the conductive feature is electrically connected to a conductive element of the semiconductor die. In addition, the method includes printing a warpage-control element over the second surface of the protective layer and the semiconductor die such that the semiconductor die is between the warpage-control element and the dielectric layer.

In accordance with some embodiments, a method for forming a chip package is provided. The method includes forming multiples conductive pillars and disposing multiple semiconductor dies over a carrier substrate. The method also includes forming a protective layer over the carrier substrate to surround the conductive pillars and the semiconductor dies. The method further includes forming a dielectric layer over the protective layer, the conductive pillars, and the semiconductor dies. In addition, the method includes forming first conductive bumps over the dielectric layer and removing the carrier substrate. The method includes forming second conductive bumps over the protective layer, and the first conductive bumps and the second conductive bumps are positioned over opposite sides of the protective layer. The method also includes forming warpage-control elements over the protective layer.

In accordance with some embodiments, a chip package is provided. The chip package includes a semiconductor die and a protective layer surrounding the semiconductor die. The chip package also includes a conductive pillar penetrating through the protective layer and separated from the semiconductor die by the protective layer. The chip package further includes a conductive bump and a warpage-control element over a same side of the protective layer. The conductive bump is electrically connected to the conductive pillar, and the warpage-control element is separated from the conductive bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor chip;
   a protective layer laterally surrounding the semiconductor chip; and
   a polymer-containing element over the protective layer, wherein the protective layer is wider than the polymer-containing element, and the polymer-containing element is wider than the semiconductor chip in a lateral direction.

2. The package structure as claimed in claim 1, wherein a direct projection of the polymer-containing element on the protective layer is laterally surrounded by outermost edges of the protective layer.

3. The package structure as claimed in claim 1, further comprising:
   a conductive structure over the protective layer, wherein the conductive structure extends upwards to exceed opposite surfaces of the polymer-containing element.

4. The package structure as claimed in claim 3, wherein the polymer-containing element extends across opposite edges of the conductive structure.

5. The package structure as claimed in claim 3, wherein the polymer-containing element is in direct contact with the conductive structure.

6. The package structure as claimed in claim 1, wherein the polymer-containing element extends across opposite edges of the semiconductor chip.

7. The package structure as claimed in claim 1, further comprising:
   a second semiconductor chip laterally surrounded by the protective layer.

8. The package structure as claimed in claim 7, further comprising:
   a second polymer-containing element over the protective layer.

9. The package structure as claimed in claim 8, wherein the second polymer-containing element extends across opposite edges of the second semiconductor chip.

10. The package structure as claimed in claim 1, further comprising:
    a redistribution structure extending across opposite edges of the semiconductor chip, wherein a portion of the protective layer is between the redistribution structure and the polymer-containing element.

11. A package structure, comprising:
    a semiconductor chip;
    a protective layer laterally surrounding the semiconductor chip; and
    a warpage-control element over the protective layer, wherein a direct projection of the warpage-control element on the protective layer is laterally surrounded by outermost edges of the protective layer, and the warpage-control element is wider than the semiconductor chip in a lateral direction.

12. The package structure as claimed in claim 11, further comprising:
    a second semiconductor chip laterally surrounded by the protective layer; and
    a second warpage-control element extending directly above the second semiconductor chip and laterally extending past opposite edges of the second semiconductor chip.

13. The package structure as claimed in claim 12, wherein the semiconductor chip and the second semiconductor chip are substantially as thick as each other.

14. The package structure as claimed in claim 11, wherein the warpage-control element is thinner than the semiconductor chip in a vertical direction.

15. The package structure as claimed in claim 11, wherein a portion of the warpage-control element is directly above the semiconductor chip, and the warpage-control element further extends past opposite edges of the semiconductor chip.

16. A package structure, comprising:
    a semiconductor chip;
    a protective layer laterally surrounding the semiconductor chip; and
    a warpage-control element over the protective layer, wherein the protective layer extends across opposite edges of the warpage-control element, and the warpage-control element is wider than the semiconductor chip in a lateral direction.

17. The package structure as claimed in claim 16, wherein the warpage-control element contains a polymer material.

18. The package structure as claimed in claim 16, wherein the warpage-control element extends across an inner portion and an edge of the semiconductor chip.

19. The package structure as claimed in claim 16, further comprising:
    a conductive structure penetrating laterally surrounded by the protective layer, wherein the conductive structure is substantially as thick as the protective layer.

20. The package structure as claimed in claim 16, further comprising:
    a second semiconductor chip laterally surrounded by the protective layer; and
    a redistribution structure extending across opposite edges of the semiconductor chip and opposite edges of the second semiconductor chip, wherein a portion of the protective layer is between the redistribution structure and the polymer-containing element.

* * * * *